(12) United States Patent
Chang et al.

(10) Patent No.: US 11,647,651 B2
(45) Date of Patent: May 9, 2023

(54) DISPLAY SCREEN AND ELECTRONIC DEVICE FOR IMPROVING THE IMAGING EFFECT

(71) Applicant: KUNSHAN GO-VISIONOX OPTO-ELECTRONICS CO., LTD., Kunshan (CN)

(72) Inventors: Miao Chang, Kunshan (CN); Lu Zhang, Kunshan (CN); Zhenzhen Han, Kunshan (CN); Siming Hu, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 17/497,897

(22) Filed: Oct. 9, 2021

(65) Prior Publication Data

US 2022/0028943 A1 Jan. 27, 2022

Related U.S. Application Data

(63) Continuation of application No. 16/511,003, filed on Jul. 15, 2019, now abandoned, which is a
(Continued)

(30) Foreign Application Priority Data

Sep. 30, 2017 (CN) .......................... 201710938804.X
Sep. 30, 2017 (CN) .......................... 201710944080.X

(51) Int. Cl.
*H10K 59/122* (2023.01)
*H10K 50/813* (2023.01)
*H10K 59/65* (2023.01)

(52) U.S. Cl.
CPC ......... *H10K 59/122* (2023.02); *H10K 50/813* (2023.02); *H10K 59/65* (2023.02)

(58) Field of Classification Search
CPC ...... H10K 59/122; H10K 59/60; H10K 59/65; H10K 59/10–1315; H01L 27/3234; H01L 27/3246; H01L 27/3258
See application file for complete search history.

(56) References Cited

U.S. PATENT DOCUMENTS

| 8,530,910 B2 * | 9/2013 | Song | H10K 59/131 313/500 |
| 2012/0049206 A1 * | 3/2012 | Choi | H10K 59/121 257/E33.062 |

(Continued)

*Primary Examiner* — Jesse Y Miyoshi
(74) *Attorney, Agent, or Firm* — Kilpatrick Townsend & Stockton LLP

(57) ABSTRACT

A display screen and an electronic device are disclosed. The display screen has a first display region and a second display region. The display screen includes an anode layer, a pixel defining layer disposed on the anode layer, a number of isolation pillars disposed on the pixel defining layer, and a driving layer group. The pixel defining layer and the isolation pillars form a sub-pixel isolation structure, and the isolation pillars, the pixel defining layer, the driving layer group, and the anode layer are disposed in the first display region and the second display region. The second display region has a vacant region corresponding to a region forming the isolation pillar and without the isolation pillar formed therein, and the pixel defining layer is provided with an opening under the vacant region.

18 Claims, 5 Drawing Sheets

Related U.S. Application Data continuation of application No. PCT/CN2018/092037, filed on Jun. 20, 2018.

(56) References Cited

U.S. PATENT DOCUMENTS

| 2013/0248867 A1* | 9/2013 | Kim | H10K 59/122 |
| | | | 438/34 |
| 2016/0254337 A1* | 9/2016 | Choi | H10K 59/1216 |
| | | | 257/40 |

* cited by examiner

DISPLAY SCREEN AND ELECTRONIC DEVICE FOR IMPROVING THE IMAGING EFFECT

CROSS REFERENCE TO RELATED APPLICATIONS

This application is a continuation of U.S. patent application Ser. No. 16/511,003, filed on Jul. 15, 2019, which is a continue application of International Application No. PCT/CN2018/092037, filed on Jun. 20, 2018, which claims priority to Chinese Patent Application Nos. 201710938804.X and 201710944080.X filed on Sep. 30, 2017, entitled "DISPLAY SCREENS AND ELECTRONIC PRODUCTS" and "DISPLAY SCREENS AND ELECTRONIC PRODUCTS". The entire contents of the above applications are incorporated herein by reference.

TECHNICAL FIELD

The present application relates to a technical field of electronic devices.

BACKGROUND

Current electronic device (such as mobile phones, tablets, etc.) are usually equipped with a front camera on a front surface thereof, and the camera is installed in a non-display region of the front surface. These electronic devices cannot be displayed in full screen.

SUMMARY

It is necessary to provide a display screen and an electronic device for improving the imaging effect.

According to an aspect of the present application, a display screen is provided. The display screen has a first display region and a second display region; the display screen includes an anode layer, a pixel defining layer disposed on the anode layer, a plurality of isolation pillars disposed on the pixel defining layer, and a driving layer group; the pixel defining layer and the isolation pillars form a sub-pixel isolation structure, and the isolation pillars, the pixel defining layer, the driving layer group, and the anode layer are disposed in the first display region and the second display region; the second display region has a vacant region corresponding to a region forming the isolation pillar and without the isolation pillar formed therein, and the pixel defining layer is provided with an opening under the vacant region; and a plurality of metal spirals are disposed in the anode layer corresponding to a region of the opening to form a plurality of surface plasmon resonance structures.

In one of the embodiments, a plurality of surface plasmon resonance structures are disposed in the driving layer group corresponding to a region of the opening, and the surface plasmon resonance structures include a plurality of metal prisms spaced apart from each other; or a plurality of metal spirals are disposed in the anode layer corresponding to the region of the opening, to form the surface plasmon resonance structures.

In one of the embodiments, the metal spirals have a width of 150 nm to 400 nm.

In one of the embodiments, the metal spirals are two-dimensional spirals.

In one of the embodiments, an arm pitch between the metal spirals is 200 nm to 500 nm.

In one of the embodiments, a planarization layer is disposed under the anode layer, and the planarization layer is provided with a through hole; and the through hole corresponds to a central region of the metal spirals.

In one of the embodiments, a radius of the through hole is 20 nm to 150 nm.

In one of the embodiments, the metal prisms are close to each other.

In one of the embodiments, the number of the metal prisms is four, and lower bottoms of the trapezoidal cross sections of the four metal prisms are inwardly and centrally symmetrically distributed.

In one of the embodiments, a gap between adjacent metal prisms is 20 nm to 50 nm.

In one of the embodiments, the metal prisms have a thickness of 20 nm to 150 nm.

In one of the embodiments, the opening is square.

In one of the embodiments, a plurality of vacant regions are provided, and the vacant regions are arranged uniformly.

In one of the embodiments, a plurality of vacant regions are provided, and the vacant regions are arranged at an interval.

In one embodiment, the display screen is an OLED display screen; the OLED display screen includes an OLED device, and the OLED device includes a cathode layer, a sub-pixel light emitting structure, the anode a layer, the pixel defining layer, and the isolation pillars; the anode layer and the cathode layer are disposed oppositely, the sub-pixel light emitting structure, the pixel defining layer, and the isolation pillars are disposed between the anode layer and the cathode layer; the pixel defining layer is disposed on the anode layer, and the isolation pillars are disposed on the pixel defining layer.

In one of the embodiments, the driving layer group includes a base layer, a buffer layer located on the base layer, a semiconductor silicon layer formed on the buffer layer, a gate insulating layer covering on the semiconductor silicon layer, a first metal layer formed on the gate insulating layer, a dielectric layer covering the first metal layer, a second metal layer formed on the dielectric layer, two interlayer insulating layers covering on the second metal layer, and a third metal layer formed on the interlayer insulating layers.

In one of the embodiments, the plasmon resonance structures provided in the driving layer group are provided in the second metal layer.

According to another aspect of the present application, an electronic device is provided. The electronic device includes: a display screen having a first display region and a second display region; the display screen comprising a plurality of isolation pillars, a pixel defining layer, a driving layer group, and an anode layer; the isolation pillars, the pixel defining layer, the driving layer group, and the anode layer being disposed in the first display region and the second display region; the second display region has a vacant region corresponding to a region forming the isolation pillar and without the isolation pillar formed therein, and the pixel defining layer is provided with an opening under the vacant region; a plurality of metal spirals being disposed in the anode layer corresponding to the region of the opening, to form a plurality of surface plasmon resonance structures; and an under-screen photosensitive module being disposed corresponding to the second display region and being capable of sensing light that is incident through the display screen.

In one of the embodiments, the under-screen photosensitive module is at least one of a photosensor and a camera.

According to the display screen and electronic device of the above aspects of the present application, the second display region has a vacant region corresponding to a region forming the isolation pillar and without the isolation pillar formed therein, and the pixel defining layer is provided with an opening under the vacant region. Through the opening, the light passing through the vacant region propagates downward without blocking and absorbing the light entering through the opening, so that the imaging effect is improved.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

At present, a display screen is divided into a first display region and a second display region, and the front camera is hidden under the second display region of the display screen; when the camera is required to take a picture, pixel dots of the second display region of the display screen are controlled to emit no light and be in a transparent state, so that the camera can take a picture. When the camera is not required to take a picture, the second display region is normally displayed, and the full screen display is realized.

However, in the above solution, a light passes through the second display region of the display screen to enter the camera for imaging, and the display screen partially blocks and absorbs the light, thereby resulting in a poor imaging effect.

The present application will be further described in detail below with reference to the accompanying drawings and embodiments to make the objects, features and advantages of the present disclosure more comprehensive and apparent. It should be understood that the specific embodiments described herein are merely illustrative of the application and are not intended to limit the scope of the application.

Figure 1:
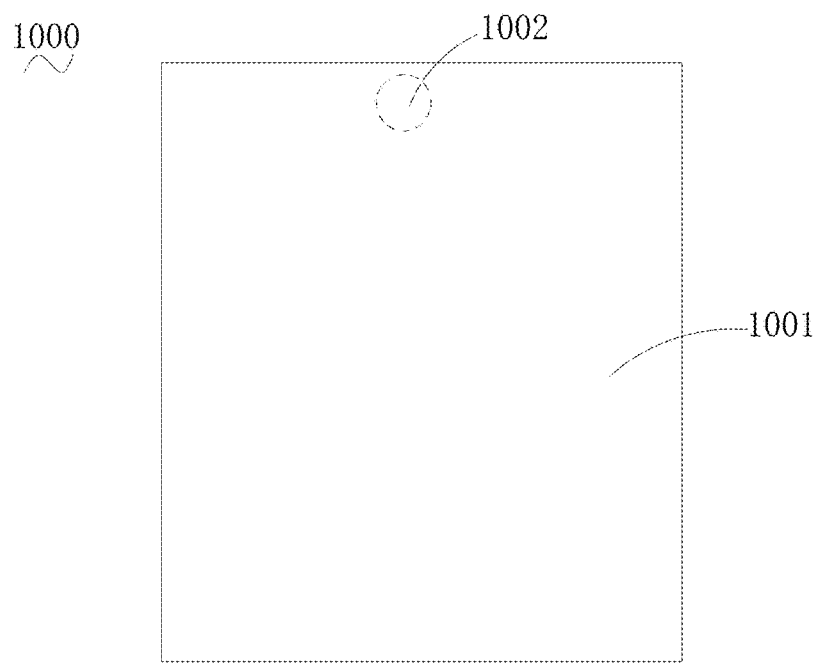
FIG. 1 is a top view of a display screen according to one embodiment of the present application.

FIG. 1 shows a top view of a display screen 1000 according to an embodiment of the present application. As shown in FIG. 1, the display screen 1000 has a first display region 1001 and a second display region 1002. The second display region 1002 has a display mode and a camera mode. In the display mode, the second display region 1002 displays an image. At this point, the second display region 1002 and the first display region 1001 can display together, so as to achieve a full-screen display function. In the camera mode, the second display region 1002 is in a transparent state so that a light outside can pass through the second display region 1002, and the light passed through the second display region 1002 can enter a under-screen photosensitive module, so that recording and imaging functions can be realized.

It can be understood that the transparent state of the second display region 1002 refers that it is transparent in a human perception, and a non-transparent region in the second display region 1002 that is not perceived by human vision is allowed.

Preferably, the second display region 1002 is circular, and more preferably, the second display region 1002 has a radius of 8.5 mm to 11 mm. Of course, it can be understood that the second display region 1002 can also be other shapes, such as a square.

In an embodiment, the display screen is an OLED display screen. The OLED display screen includes OLED devices. The OLED devices include a cathode layer, a sub-pixel light emitting structure, an anode layer, a pixel defining layer, and a plurality of isolation pillars. The anode layer and the cathode layer are arranged oppositely, and the sub-pixel light emitting structure, the pixel defining layer and the isolation pillars are arranged between the anode layer and the cathode layer. The pixel defining layer is arranged on the anode layer, and the isolation pillars are arranged on the pixel defining layer. The pixel defining layer and the isolation pillars form a sub-pixel isolation structure together.

In the present embodiment, an AMOLED display screen is taken as an example for illustration. It can be understood that the present application is not limited to an AMOLED display screen, and can also be a PMOLED display screen.

Figure 2:
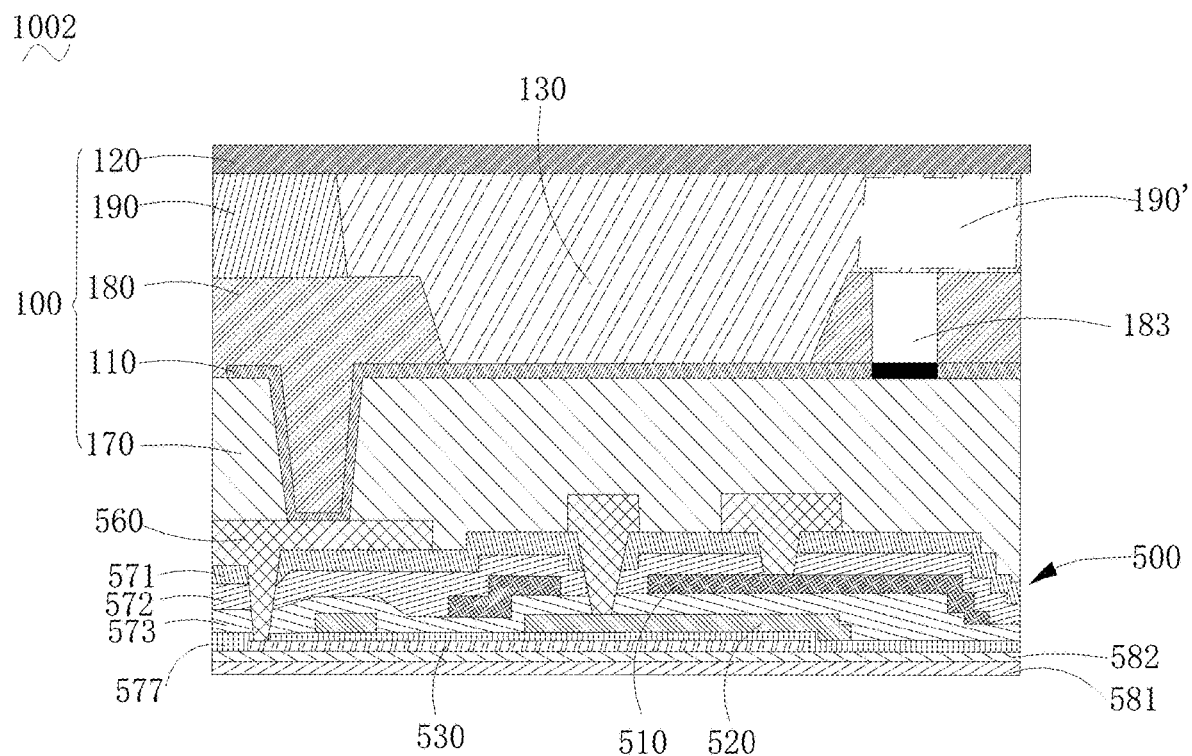
FIG. 2 is a partial cross-sectional view of a second display region of a display screen according to an embodiment of the present application.

FIG. 2 shows a cross-sectional view of a part of the second display region 1002 of the display screen 1000 according to an embodiment of the present application. The display screen 1000 includes a driving layer group 500, and an OLED device 100 formed on the driving layer group 500. The OLED device 100 includes an anode layer 110, a cathode layer 120 opposite to the anode layer 110, a sub-pixel light emitting structure 130 between the anode layer 110 and the cathode layer 120, and the sub-pixel isolation structure located on two sides of the sub-pixel light emitting structure 130. The sub-pixel isolation structure is also located between the anode layer 110 and the cathode layer 120. The sub-pixel isolation structure includes a pixel defining layer 180 formed on the anode layer 110 and the isolation pillars 190 located on the pixel defining layer 180. Further, the anode layer 110 is a metal anode layer, and the cathode layer 120 is a metal cathode layer.

The driving layer group 500 generally includes devices such as thin film transistors and capacitors.

In this embodiment, in particular, the driving layer group 500 includes a base layer 581 at the bottom, a buffer layer 582 located on the base layer 581, a semiconductor silicon layer 530 formed on the buffer layer 582, a gate insulating layer 577 (commonly referred to as GI) covering on the semiconductor silicon layer 530, a first metal layer 520 (commonly referred to as a M1 layer, which can form a lower electrode of a capacitor and a gate of a Thin film transistor) formed on the gate insulating layer 577, a dielectric layer 573 (commonly referred to as CI) covering the first metal layer 520, and a second metal layer 510 (commonly referred to as the M2, which can form an upper electrode of the capacitor) formed on the dielectric layer 573, two interlayer insulating layers 571 and 572 (commonly referred to as ILD) covering on the second metal layer 510, and a third metal layer 560 (commonly referred to as M3) formed on the interlayer insulating layers 571 and 572.

Hereinafter, the specific structure of the afore-mentioned driving layer group 500 will be described as an example. However, it can be understood that the driving layer group 500 of the present application is not limited to the afore-mentioned structure, and can be other structures. Other structures can be understood by referring to the afore-mentioned structure and will not be repeated herein.

In this application, the first display region 1001 is designed according to a normal display structure design. The display screen 1000 includes the isolation pillars 190 arranged in the first display region 1001, the pixel defining layer 180, the driving layer 500, and the metal anode layer 110. The pixel defining layer 180 is arranged on the metal anode layer 110, the isolation pillars 190 is arranged on the pixel defining layer 180, and the pixel defining layer 180 and the isolation pillars 190 form the sub-pixel isolation structure. The second display region 1002 is specially designed. A structural design of the second display region 1002 of the display screen 1000 will be described in detail below.

The second display region 1002 has a vacant region 190' corresponding to a region forming the isolation pillar and without the isolation pillar formed therein. The pixel defining layer 180 is provided with an opening 183 under the vacant region 190'.

Further, a plurality of metal spirals 111 is provided on the metal anode layer 110 corresponding to a region of the opening 183 (i.e., a region marked in black in FIG. 2), so as to form a surface plasmon resonance structure 5. Alternatively, the second display region 1002 has a vacant region 190' corresponding to a region forming the isolation pillar and without the isolation pillar formed therein, and the pixel defining layer 180 is provided with an opening 183 under each vacant region 190'. The second metal layer 510 in the driving layer group 500 corresponding to a region of one opening 183 (i.e., a black region in FIG. 3) is provided with a plurality of surface plasmon resonance structures 5, and each surface plasmon resonance structure 5 includes metal prisms 511 arranged at an interval.

Figure 4:
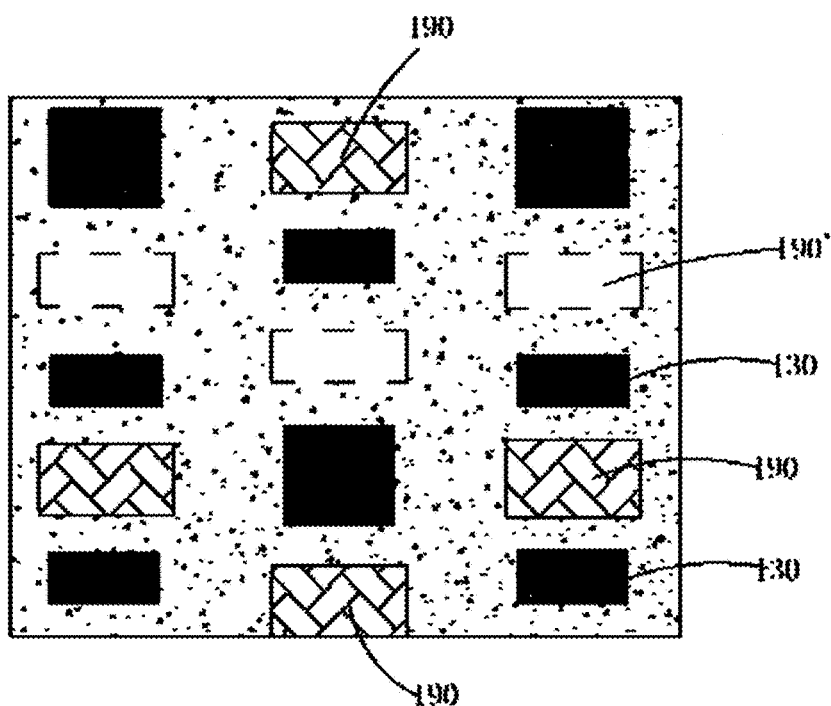
FIG. 4 is a schematic view according to an embodiment of the present application illustrating that the second display region has a vacant region corresponding to a region forming the isolation pillar and without the isolation pillar formed therein.

FIG. 4 shows a schematic view according to an embodiment of the present application illustrating that the second display region has a vacant region corresponding to a region forming the isolation pillar and without the isolation pillar formed therein. When designing the second display region 1002 of the display screen 1000, a portion of the isolation pillars 190 are not designed. In the second display region 1002, one vacant region can be provided corresponding to one sub-pixel unit, or two or more vacant regions 190 can be provided. However, it can be understood that at least one isolation pillar 190 corresponding to one sub-pixel unit should be provided.

Preferably, a plurality of vacant regions 190' are provided in the second display region 1002, and the vacant regions 190' are arranged uniformly. It means that there is also a normal isolation pillar 190 in a middle of adjacent vacant regions 190'. This can help to minimize an adverse effect caused by providing the vacant regions 190'.

More preferably, the vacant regions 190' of the second display region 1002 are arranged uniformly, that is, the vacant regions 190 are evenly distributed in the second display region 1002. In this way, an antireflection of the light is enhanced more evenly, further improving the imaging effect.

Referring to FIG. 2 again, a primary function of the opening 183 is that the light passing through the vacant region 190' can propagate downward through the opening 183.

In the present embodiment, a cross-sectional shape of the opening 183 is a square. Thus, the cross-sectional shape of the opening 183 is kept in conformity with the shape of the pixel defining layer, thereby facilitating the smooth formation of the opening 183. Preferably, the opening 183 has a size of 10 um to 20 um.

Of course, it can be understood that the cross section of the opening 183 is not limited to a square, and can be other shapes such as a circle, a triangle, etc.

The light continues to propagate downward, and when the light passes through the surface plasmon resonance structures 5, the surface plasmon resonance structures 5 enhances the antireflection of the light and the light is transmitted into interior of the display 1000.

Figure 5:
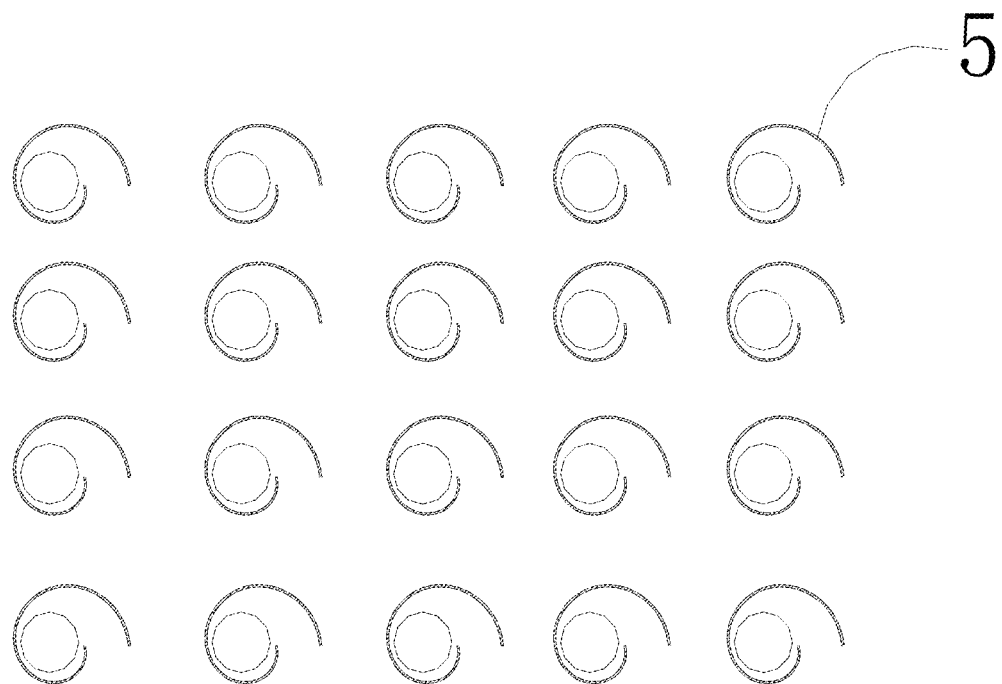
FIG. 5 is a schematic view of a part of an anode layer of a display screen (a region corresponding to an opening) according to an embodiment of the present application.
Figure 6:
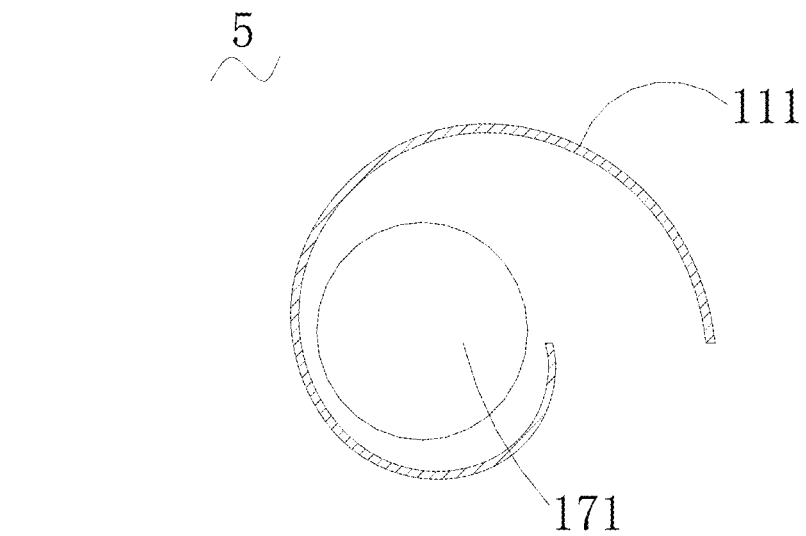
FIG. 6 is a schematic view of a surface plasmon resonance structure according to an embodiment of the present application.

FIG. 5 shows a schematic view of a part of the metal anode layer of the display screen (a region corresponding to the opening) according to an embodiment of this application; FIG. 6 shows a schematic view of the plasmon resonance structure according to an embodiment of this application. Only a partial number of surface plasmon resonance structures 5 in the region corresponding to one opening 183 are shown in FIG. 5.

When manufacturing the metal anode layer 110, the metal anode layer 110 corresponding to the region of the opening 183 is patterned to form the plurality metal spirals 111. The metal spirals 111 constitute the surface plasmon resonance structures 5.

It can be understood that an outer side of the metal spiral 111 in the surface plasmon resonance structure 5 is blank, that is, the surface plasmon resonance structures 5 are separated from the anode of the OLED device, and the surface plasmon resonance structures 5 do not affect a normal operation of the anode.

Preferably, the metal spiral 111 has a width of 150 nm to 400 nm. In this way, it is more beneficial for an excitation of surface plasmon polaritons.

In the present embodiment, the metal spiral 111 is an Archimedes spiral. Of course, it can be understood that the metal spiral 111 can also be other two-dimensional spirals, such as isometric spirals.

Preferably, an arm pitch between the metal spirals 111 is 200 nm to 500 nm. In this way, it is more beneficial for the excitation of the surface plasmon polaritons.

Preferably, an initial radius of the metal spiral 111 is 200 nm to 500 nm. In this way, it is more beneficial for the excitation of the surface plasmon polaritons.

Preferably, the number of turns of the metal spirals 111 is at least one turn. In this way, it is easy to manufacture.

Preferably, the metal spiral 111 has a thickness of 50 nm to 200 nm. In this way, it is beneficial for the excitation of surface plasmon polaritons on the one hand and beneficial for transmission of light field energy on the other hand.

In an embodiment, the planarization layer 170 under the metal anode layer 110 is provided with a through hole 171; and the through hole 171 is located within a region corresponding to the central region of the metal spiral 111. Thus, the through hole 171 can be coupled to the surface plasmon resonance structures 5, so that the light field energy can be better coupled to an underside. Further, the planarization layer 170 is disposed in contact with the third metal layer 560 and the interlayer insulating layer 571 in the driving layer group 500.

Preferably, the through hole is circular, which has the advantage that a field distribution of the metal spiral 111 formed in its central region is circular, and the circular through holes allow the light field energy to be better coupled to the underside.

Preferably, the through hole 171 has a radius of 50 nm to 150 nm. In this way, a coupling effect of the through hole 171 to the surface plasmon resonance structures 5 can be further improved.

A light antireflection process of the present application will be described below.

When the light is emitted downward from an upper side in FIG. 2, the light passes through the vacant region 190' firstly, and then through the opening 183 of the pixel defining layer 180. When the light emits to the metal anode layer 110 below the opening 183, due to the presence of the surface plasmon resonance structures 5, a fading wave is generated in a direction perpendicular to a light propagating direction on the surface of the metal anode layer 110. The fading wave can cause free electrons on a metal surface to generate a surface plasma polariton. A frequency and wave number of the fading wave and the surface plasmon polariton are equal, and the surface plasmon polariton resonates with the fading wave, which enhances the light transmission.

A simulation test is carried out using a finite element numerical calculation method. Parameters are set as follows: a width of the metal spiral is 275 nm, an initial radius of the metal spiral is 380 nm, an arm pitch of the metal spiral is 380 nm, and a film thickness of the metal spiral is 100 nm. A test result is shown in FIG. 7.

Figure 7:
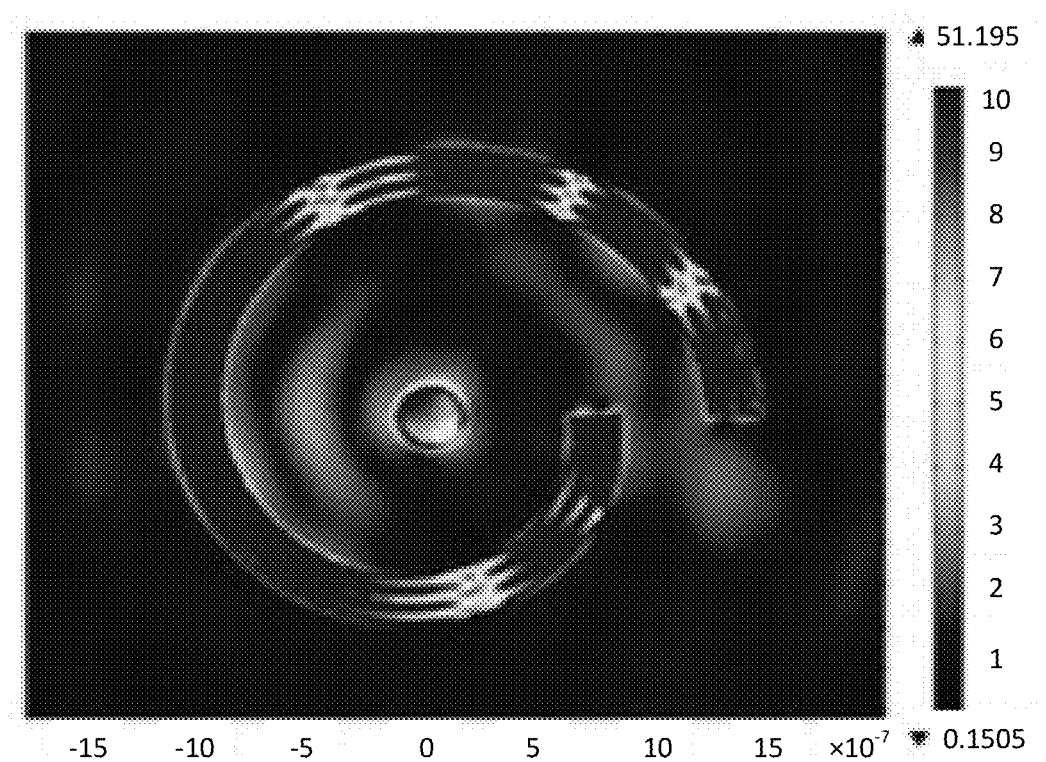
FIG. 7 is a simulation test view according to an embodiment of the present application.

In FIG. 7, a color bar on the right side represents a relative intensity of the electric field, and the left side represents a relative intensity distribution of the electric field. It can be seen from FIG. 7 that a color of the middle region (at the metal spiral) is redder than a color of a region of the two sides, which indicates that the relative intensity of the electric field here is stronger, and further indicates that the energy of the light is large, and a projection of the light is enhanced here.

Figure 8:
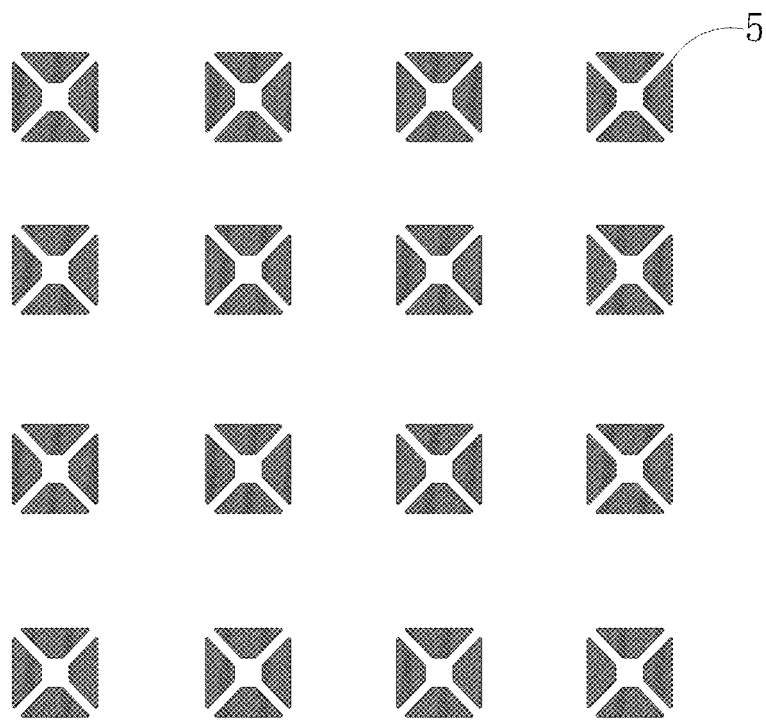
FIG. 8 is a schematic view of a part of a metal layer of a display screen (a region corresponding to an opening) according to an embodiment of the present application.
Figure 9:
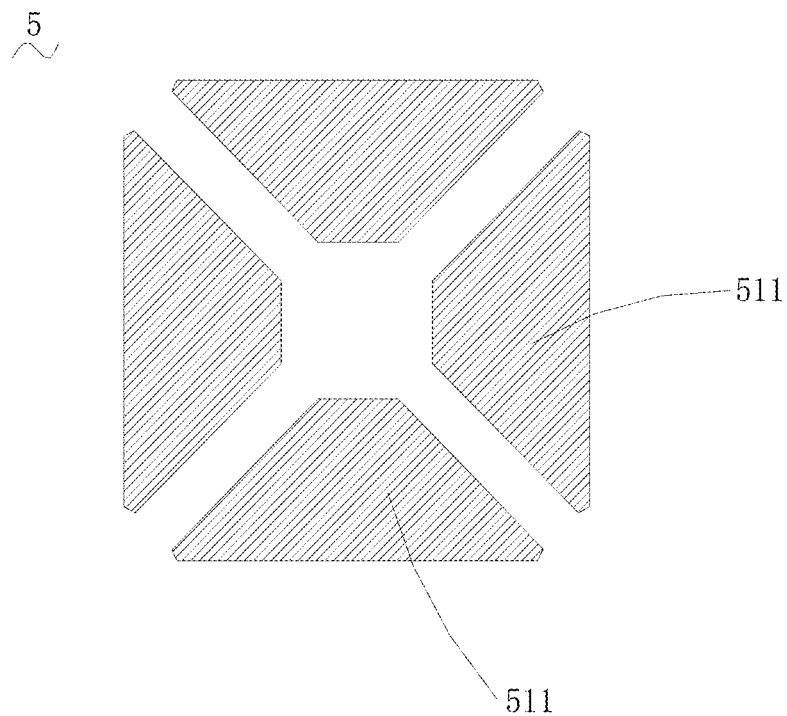
FIG. 9 is a schematic view of the surface plasmon resonance structure according to an embodiment of the present application.

Alternatively, referring to FIG. 8 and FIG. 9, FIG. 8 is a schematic view of a part of the metal layer of the display screen (an region corresponding to an opening) according to an embodiment of the present application. Only a partial number of the surface plasmon resonance structures 5 in the region corresponding to one opening 183 are shown in FIG. 8.

The plasmon resonance structure 5 provided in the driving layer group 500 is provided in the second metal layer 510. When manufacturing the driving layer group 500, the second metal layer 510 corresponding to the region of the predetermined opening 183 is patterned to form the plurality of metal prisms 511 arranged at an interval. The patterned second metal layer 510 constitutes the surface plasmon resonance structures 5.

In the present embodiment, the second metal layer 510 is located in the same layer as the upper electrode of the capacitor in the driving layer group 500. A patterning density of this layer is relatively low, which is good for patterning.

In the surface plasmon resonance structures 5, the number of the metal prisms 511 is multiple and the metal prisms are close to each other. In this way, it is beneficial for the excitation of the surface plasmon polaritons.

Preferably, the metal prisms 511 have trapezoidal cross sections. The trapezoids can be formed as a shape similar to a bow, which is more beneficial for the excitation of the surface plasmon polaritons.

More preferably, a lower bottom of the trapezoid is 100 to 150 nm, an upper bottom of the trapezoid is 20 to 50 nm, a height of the trapezoid is 40 to 65 nm, and a gap between adjacent trapezoids is 20 to 50 nm. In this way, it can be beneficial for the excitation of the plasmon polaritons on the metal surface.

More preferably, four trapezoids are provided; the lower bottoms of the four trapezoids are inwardly and centrally symmetrically distributed. In this way, the surface plasmon polaritons generated between two trapezoids are coupled to each other, which can further enhance an antireflection of the field strength.

Preferably, the metal prism 511 has a thickness of 20 nm to 150 nm. It is beneficial for the excitation of surface plasmon polaritons on one hand, and beneficial for the transmission of the light field energy on the other hand.

Of course, it can be understood that the surface plasmon resonance structure of the present application is not limited to the structure formed by two metal prisms, and can be other numbers of metal prisms.

In another preferred embodiment, a plurality of through holes 171 are formed in the planarization layer 170 on the second metal layer 510, which are corresponding to the openings 183 of the pixel defining layer 180. In this way, light absorption of the planarization layer 170 can be further reduced, and is more beneficial for antireflection. More preferably, the through holes 171 are corresponding to the openings 183 and have the same size and shape. Further, the planarization layer 170 is disposed in contact with the third metal layer 560 and the interlayer insulating layer 571 in the driving layer group 500.

Of course, it can be understood that the through hole may not be provided in the present application.

The antireflection process of the light of the present application will be described below.

Figure 3:
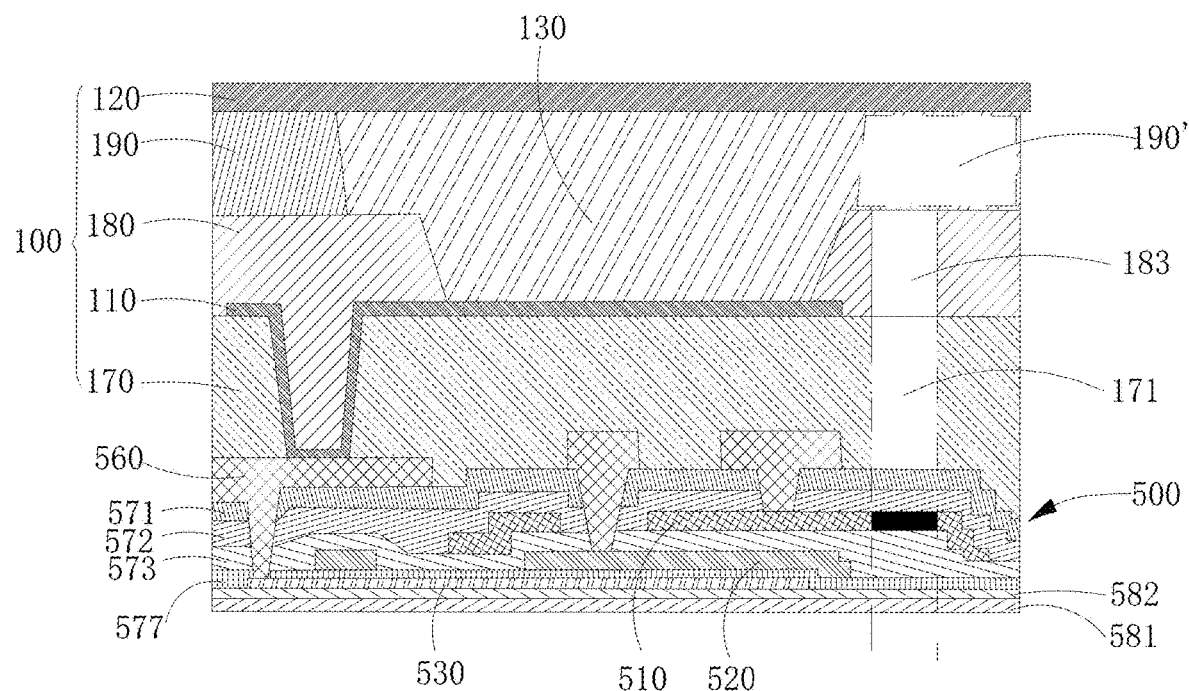
FIG. 3 is a partial cross-sectional view of a second display region of a display screen according to another embodiment of the present application.

When the light is emitted downward from an upper side in FIG. 3, the light passes through a region of the vacant regions 190' firstly, and then through the opening 183 of the pixel defining layer 180 and enters into the driving layer group 500. When the light emits to the second metal layer 510 below the opening 183, due to the presence of the surface plasmon resonance structures 5, the fading wave is generated in the direction perpendicular to the light propagating direction on the surface of the second metal layer 510. The fading wave can cause the free electrons on the metal surface to generate the excitation of the surface plasma polaritons. A frequency and wave number of the fading wave and the surface plasmon polariton are equal, and the surface plasmon polariton resonates with the fading wave, which enhances the light transmission.

The application also provides an electronic device.

Figure 10:
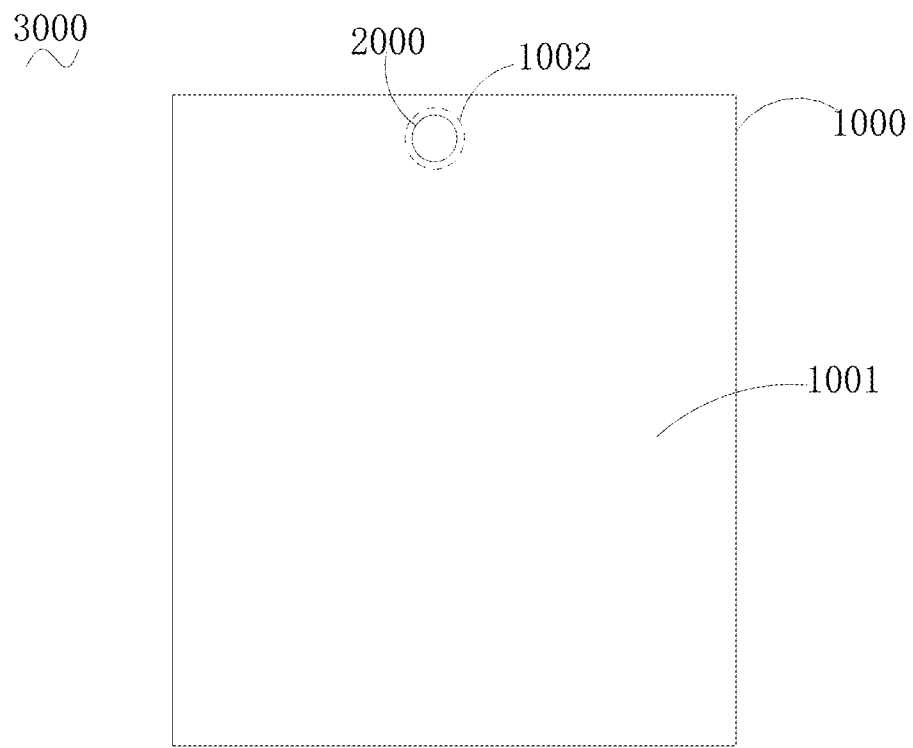
FIG. 10 is a top view of an electronic device according to an embodiment of the present application.

Referring to FIG. 10, an electronic device 3000 includes a display screen 1000 and an under-screen photosensitive module 2000; the display screen is a display screen provided in the present application; the under-screen photosensitive module 2000 is disposed corresponding to the second display region 1002 of the display screen 1000, so that the light passing through the second display region 1002 enters into the under-screen photosensitive module 2000.

Preferably, the under-screen photosensitive module 1002 is at least one of a photoelectric sensor and a camera.

Preferably, the electronic device is a mobile phone or a tablet. Of course, it can be understood that the electronic device of the present application is not limited thereto, and may be other electronic products, such as a computer display with a camera.

Of course, it can be understood that the electronic device includes other components such as a casing, a power source, or the like in addition to the display screen and the under-screen photosensitive module. The specific structure and the connection relationship of these other components can be set by the person skilled in the art according to an actual situation, and details are not described herein.

According to the electronic device of the present application, since the display screen provided in the present application is used, the light intensity of the light entering the under-screen photosensitive module is increased, thereby improving the imaging effect.

The forgoing embodiments are merely illustrative of several embodiments of the present disclosure, and the description thereof is more specific and detailed, but is not intended to limit the scope of the present disclosure. It should be noted that a number of variations and modifications can be made by those skilled in the art without departing from the spirit and scope of the present disclosure. Therefore, the scope of the present disclosure should be determined by the appended claims.

What is claimed is:

1. A display screen having a first display region and a second display region, comprising:
    a driving layer group;
    an anode layer;
    a pixel defining layer disposed on the anode layer; and
    a plurality of isolation pillars disposed on the pixel defining layer;
    wherein the pixel defining layer and the isolation pillars form a sub-pixel isolation structure, and the isolation pillars, the pixel defining layer, the driving layer group, and the anode layer are disposed in the first display region and the second display region; the second display region has a vacant region corresponding to a region forming the isolation pillar and without the isolation pillar formed therein, and the pixel defining layer is provided with an opening under the vacant region; a plurality of metal spirals are disposed in the anode layer corresponding to a region of the opening to form a plurality of surface plasmon resonance structures.

2. The display screen of claim 1, wherein the metal spirals have a width of 150 nm to 400 nm.

3. The display screen of claim 1, wherein the metal spirals are two-dimensional spirals.

4. The display screen of claim 1, wherein the metal spirals are Archimedes spirals.

5. The display screen of claim 4, wherein an arm pitch between the metal spirals is 200 nm to 500 nm.

6. The display screen of claim 4, wherein an initial radius of each of the metal spirals is 200 nm to 500 nm.

7. The display screen of claim 1, wherein:
    a planarization layer is disposed under the anode layer, and the planarization layer is provided with a through hole; and
    the through hole corresponds to a central region of the metal spirals.

8. The display screen of claim 7, wherein a cross-section of the through hole is circular, and a radius of the through hole is 20 nm to 150 nm.

9. The display screen of claim 1, wherein a cross-sectional shape of the opening is a square.

10. The display screen of claim 1, wherein the plurality metal spirals is formed by patterning the anode layer corresponding to the region of the opening.

11. The display screen of claim 1, further comprising a plurality of vacant regions arranged uniformly.

12. The display screen of claim 1, further comprising a plurality of vacant regions arranged at an interval.

13. The display screen of claim 1, wherein:
    the display screen is an OLED display screen;
    the OLED display screen comprises an OLED device;
    the OLED device comprises a cathode layer, a sub-pixel light emitting structure, the anode a layer, the pixel defining layer, and the isolation pillars;
    the anode layer and the cathode layer are disposed oppositely, the sub-pixel light emitting structure, the pixel defining layer, and the isolation pillars are disposed between the anode layer and the cathode layer.

14. The display screen of claim 1, wherein the driving layer group comprises a base layer, a buffer layer located on the base layer, a semiconductor silicon layer formed on the buffer layer, a gate insulating layer covering on the semiconductor silicon layer, a first metal layer formed on the gate insulating layer, a dielectric layer covering the first metal layer, a second metal layer formed on the dielectric layer, two interlayer insulating layers covering on the second metal layer, and a third metal layer formed on the interlayer insulating layers.

15. The display screen of claim 14, wherein a planarization layer is disposed in contact with the third metal layer and the interlayer insulating layer in the driving layer group.

16. An electronic device, comprising:
    a display screen having a first display region and a second display region; the display screen comprising a plurality of isolation pillars, a pixel defining layer, a driving layer group and an anode layer; the isolation pillars, the pixel defining layer, the driving layer group and the anode layer being disposed in the first display region and the second display region;
    the second display region has a vacant region corresponding to a region forming the isolation pillar and without the isolation pillar formed therein, and the pixel defining layer is provided with an opening under the vacant region;
    a plurality of metal spirals being disposed in the anode layer corresponding to the region of the opening to form a plurality of surface plasmon resonance structures; and
    an under-screen photosensitive module being disposed corresponding to the second display region and being capable of sensing light that is incident through the display screen.

17. The electronic device of claim 16, wherein the under-screen photosensitive module comprises a photosensor or a camera.

18. The electronic device of claim 16, wherein the plurality of surface plasmon structures is configured to generate a fading wave, which resonates with a surface plasmon polariton to enhance light transmission.

\* \* \* \* \*